(12) United States Patent
Kwon

(10) Patent No.: US 8,779,282 B2
(45) Date of Patent: Jul. 15, 2014

(54) SOLAR CELL APPARATUS AND METHOD FOR MANUFACTURING THE SAME

(75) Inventor: Se Han Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/322,061

(22) PCT Filed: Sep. 30, 2010

(86) PCT No.: PCT/KR2010/006705
§ 371 (c)(1),
(2), (4) Date: Nov. 22, 2011

(87) PCT Pub. No.: WO2011/040778
PCT Pub. Date: Apr. 7, 2011

(65) Prior Publication Data
US 2012/0174973 A1   Jul. 12, 2012

(30) Foreign Application Priority Data

Sep. 30, 2009 (KR) .................. 10-2009-0093567

(51) Int. Cl.
*H01L 31/0224* (2006.01)
(52) U.S. Cl.
USPC .......... 136/256; 136/265; 136/262; 136/264; 136/252; 438/66; 438/95; 438/94; 438/98
(58) Field of Classification Search
USPC ............ 136/256, 265, 262, 264, 252; 438/66, 438/95, 94, 98
See application file for complete search history.

(56) References Cited

U.S. PATENT DOCUMENTS

| | | | |
|---|---|---|---|
| 4,631,801 A | 12/1986 | Yamazaki | |
| 5,264,048 A * | 11/1993 | Yoshikawa et al. | 257/40 |
| 5,660,646 A * | 8/1997 | Kataoka et al. | 136/251 |
| 5,981,868 A * | 11/1999 | Kushiya et al. | 136/262 |
| 6,137,048 A * | 10/2000 | Wu et al. | 136/260 |
| 6,259,016 B1 | 7/2001 | Negami et al. | |
| 6,441,301 B1 * | 8/2002 | Satoh et al. | 136/265 |
| 6,534,704 B2 * | 3/2003 | Hashimoto et al. | 136/265 |
| 7,132,598 B2 * | 11/2006 | Nelles et al. | 136/263 |
| 7,479,596 B2 * | 1/2009 | Hashimoto et al. | 136/256 |
| 8,110,427 B2 * | 2/2012 | Hsieh | 438/94 |

(Continued)

FOREIGN PATENT DOCUMENTS

| | | | |
|---|---|---|---|
| JP | 62-173765 A | 7/1987 | |
| JP | 10-074967 A | 3/1998 | |

(Continued)

OTHER PUBLICATIONS

Decision of Grant dated Sep. 5, 2011 in Korean Application No. 10-2009-0093567, filed Sep. 30, 2009.

(Continued)

*Primary Examiner* — Golam Mowla
(74) *Attorney, Agent, or Firm* — Saliwanchik, Lloyd & Eisenschenk

(57) ABSTRACT

Disclosed are a solar cell apparatus and a method for manufacturing the same. The solar cell apparatus includes a substrate; a back electrode layer on the substrate; a light absorbing layer on the back electrode layer; and a front electrode layer on the light absorbing layer, wherein an outer peripheral side of the back electrode layer is aligned on a plane different from a plane of an outer peripheral side of the light absorbing layer.

6 Claims, 4 Drawing Sheets

(56) References Cited

U.S. PATENT DOCUMENTS

| | | | |
|---|---|---|---|
| 8,329,494 B2* | 12/2012 | Denda et al. | 438/57 |
| 2005/0028861 A1* | 2/2005 | Aoki et al. | 136/256 |
| 2005/0072461 A1* | 4/2005 | Kuchinski et al. | 136/256 |
| 2005/0109389 A1* | 5/2005 | Middelman et al. | 136/256 |
| 2005/0161076 A1* | 7/2005 | Shiozaki | 136/256 |
| 2005/0253142 A1* | 11/2005 | Negami et al. | 257/65 |
| 2006/0266409 A1 | 11/2006 | Takeda et al. | |
| 2007/0163646 A1 | 7/2007 | Kushiya et al. | |
| 2007/0283998 A1* | 12/2007 | Kuriyagawa et al. | 136/256 |
| 2008/0271781 A1* | 11/2008 | Kushiya et al. | 136/256 |
| 2009/0032094 A1* | 2/2009 | Aoki | 136/256 |
| 2009/0133749 A1* | 5/2009 | Yonezawa | 136/256 |
| 2009/0194160 A1* | 8/2009 | Chin et al. | 136/256 |
| 2009/0242022 A1* | 10/2009 | Yonezawa | 136/256 |
| 2009/0277499 A1* | 11/2009 | Aoki et al. | 136/256 |
| 2009/0314337 A1* | 12/2009 | Lee et al. | 136/255 |
| 2010/0229938 A1* | 9/2010 | Nishino et al. | 136/256 |
| 2011/0108107 A1 | 5/2011 | Uchida et al. | |
| 2011/0180135 A1* | 7/2011 | Koike et al. | 136/256 |
| 2011/0186103 A1* | 8/2011 | Kobayashi et al. | 136/244 |
| 2012/0037225 A1* | 2/2012 | Jee et al. | 136/256 |
| 2012/0042942 A1* | 2/2012 | Park et al. | 136/256 |
| 2012/0073645 A1* | 3/2012 | Sung | 136/256 |
| 2012/0111388 A1* | 5/2012 | Sung | 136/244 |
| 2012/0273039 A1* | 11/2012 | Pak | 136/256 |
| 2012/0279545 A1* | 11/2012 | Lu et al. | 136/244 |

FOREIGN PATENT DOCUMENTS

| | | |
|---|---|---|
| JP | 2000-323733 A | 11/2000 |
| JP | 2002-043599 A | 2/2002 |
| JP | 2006-332453 A | 12/2006 |
| JP | 2008-192754 A | 8/2008 |
| KR | 10-2007-0004593 A | 1/2007 |
| KR | 10-2008-0009346 A | 1/2008 |
| WO | WO-2009-139390 A1 | 11/2009 |

OTHER PUBLICATIONS

International Search Report in International Application No. PCT/KR2010/006705, filed Sep. 30, 2010.

Japanese Office Action, dated Feb. 4, 2014, in Japanese Application No. 2012-532014.

Chinese Office Action dated Mar. 4, 2014, in Chinese Application No. 201080042839.1.

* cited by examiner

SOLAR CELL APPARATUS AND METHOD FOR MANUFACTURING THE SAME

CROSS-REFERENCE TO RELATED APPLICATIONS

This application is the U.S. national stage application of International Patent Application No. PCT/KR2010/006705, filed Sep. 30, 2010, which claims priority to Korean Application No. 10-2009-0093567, filed Sep. 30, 2009, the disclosures of each of which are incorporated herein by reference in their entirety.

BACKGROUND

The embodiment relates to a solar cell apparatus and a method for manufacturing the same.

Recently, as energy consumption is increased, a solar cell has been developed to convert solar energy into electrical energy.

In particular, a CIGS-based cell, which is a PN hetero junction apparatus having a substrate structure including a glass substrate, a metallic back electrode layer, a P type CIGS-based light absorbing layer, a high-resistance buffer layer, and an N type window layer, has been extensively used.

In such a solar cell, the above layers are sequentially deposited on a back surface of the substrate and each layer may have a region having a deposition level different from that of other regions.

Therefore, the electric short may occur as a solar cell module is connected to an external device. In this case, the electric characteristics of the solar cell may be degraded.

SUMMARY

The embodiment provides a solar cell apparatus having improved electric characteristics by blocking leakage current at an edge region of a substrate and a method for manufacturing the same.

A solar cell apparatus according to the embodiment includes a substrate; a back electrode layer on the substrate; a light absorbing layer on the back electrode layer; and a front electrode layer on the light absorbing layer, wherein an outer peripheral side of the back electrode layer is aligned on a plane different from a plane of an outer peripheral side of the light absorbing layer.

A method for manufacturing a solar cell apparatus according to the embodiment includes the steps of forming a back electrode layer on a substrate; forming a light absorbing layer on the back electrode layer; forming a front electrode layer on the light absorbing layer; primarily removing outer peripheral portions of the back electrode layer, the light absorbing layer and the front electrode layer; and secondarily removing the outer peripheral portion of the back electrode layer after the outer peripheral portion of the back electrode layer has been primarily removed.

A method for manufacturing a solar cell apparatus according to the embodiment includes the steps of forming a back electrode layer on a substrate; forming a light absorbing layer on the back electrode layer; forming a front electrode layer on the light absorbing layer; primarily removing outer peripheral portions of the light absorbing layer and the front electrode layer; and secondarily removing an outer peripheral portion of the back electrode layer.

According to the solar cell apparatus of the embodiment, the outer peripheral side of the back electrode layer is aligned on the plane different from the plane where the outer peripheral side of the light absorbing layer is aligned. In addition, the outer peripheral side of the back electrode layer has a recess structure recessed inward. Thus, the distance between the outer peripheral side of the back electrode layer and the outer peripheral side of the front electrode layer may be increased corresponding to the recess structure.

Therefore, the solar cell apparatus according to the embodiment can prevent the electric short from occurring between the outer peripheral side of the back electrode layer and the outer peripheral side of the front electrode layer. In addition, the solar cell apparatus according to the embodiment can block the leakage current flowing through the outer peripheral side of the back electrode layer and the outer peripheral side of the front electrode layer.

Further, according to the method for manufacturing the solar cell apparatus of the embodiment, the outer peripheral regions can be patterned without using a laser. In detail, the edge deletion process can be performed through the mechanical scribing process and the etching process.

Thus, the solar cell apparatus according to the embodiment can be easily manufactured.

In addition, according to the method for manufacturing the solar cell apparatus of the embodiment, the outer peripheral region is primarily patterned and then secondarily patterned by using etchant. Thus, impurities can be removed from the outer peripheral region so that the electric short caused by the impurities can be prevented.

Therefore, the solar cell apparatus according to the embodiment can prevent the electric short and the leakage current from occurring at the back electrode layer and the front electrode layer. As a result, the solar cell apparatus according to the embodiment can improve the electric characteristics and the photoelectric conversion efficiency.

DETAILED DESCRIPTION OF THE EMBODIMENTS

Figure 1:
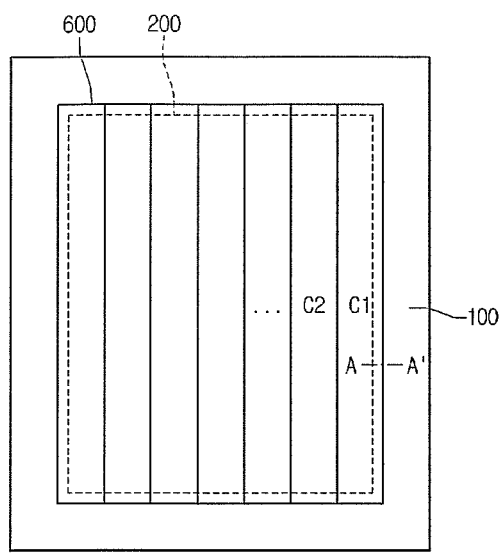
FIG. 1 is a plan view showing a solar cell apparatus according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
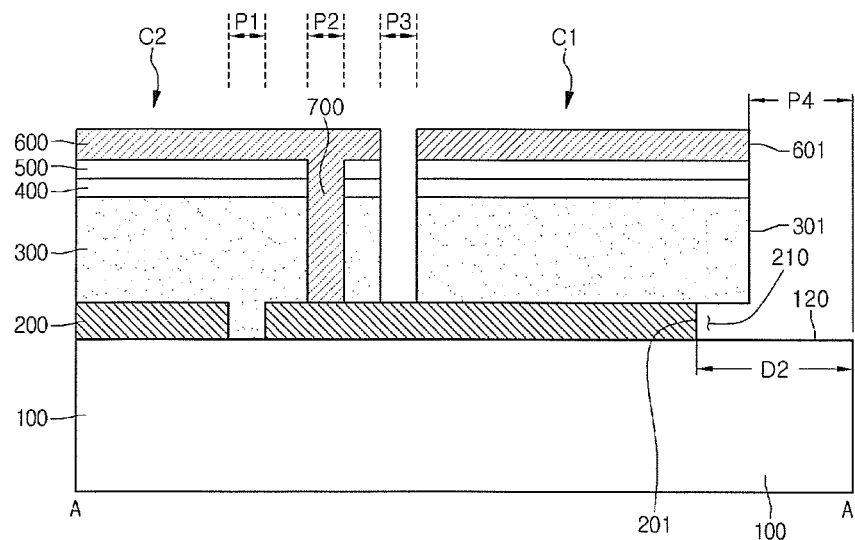
FIG. 2 is a sectional view taken along line A-A' of FIG. 1.

FIG. 1 is a plan view showing a solar cell apparatus according to the embodiment, and FIG. 2 is a sectional view taken along line A-A' of FIG. 1.

Referring to FIGS. 1 and 2, the solar cell apparatus according to the embodiment includes a support substrate 100, a back electrode layer 200, a light absorbing layer 300, a buffer layer 400, a high-resistance buffer layer 500, a front electrode layer 600 and a plurality of connectors 700.

The support plate 100 has a plate shape and supports the back electrode layer 200, the light absorbing layer 300, the buffer layer 400, the high-resistance buffer layer 500, the front electrode layer 600 and the connectors 700.

The support substrate 100 may include an insulating material. The support substrate 100 may be a glass substrate, a plastic substrate or a metal substrate. In detail, the support substrate 100 may be a soda lime glass. The support substrate 100 may be transparent, flexible or rigid.

The back electrode layer 200 is disposed on the support substrate 100. An outer peripheral side 201 of the back electrode layer 200 extends along an outer peripheral portion of the support substrate 100. That is, the outer peripheral side 201 of the back electrode layer 200 corresponds to the outer peripheral portion of the support substrate 100.

The outer peripheral side 201 of the back electrode layer 200 is disposed inside the outer peripheral portion of the support substrate 100. That is, the outer peripheral side 201 of the back electrode layer 200 is disposed at a region different from a region of an outer peripheral side of the support substrate 100. In addition, the back electrode layer 200 forms a step difference with respect to the support substrate 100.

When viewed from the top, the back electrode layer 200 may have a rectangular shape. The back electrode layer 200 is a conductive layer. For instance, the back electrode layer 200 may include a metal, such as molybdenum.

In addition, the back electrode layer 200 may include at least two layers. In this case, the layers may be formed by using the same metal or different metals.

First perforation holes P1 are formed in the back electrode layer 200. The first perforation holes P1 serve as an open region to expose the top surface of the support substrate 100. When viewed from the top, the first perforation holes P1 extend in one direction.

The perforation holes P1 may have a width in the range of about 80 μm to about 200 μm.

The back electrode layer 200 is divided into a plurality of back electrodes by the first perforation holes P1. That is, the back electrodes are defined by the first perforation holes P1.

The back electrodes are spaced apart from each other by the first perforation holes P1. The back electrodes are arranged in the form of a stripe.

In addition, the back electrode can be arranged in the form of a matrix. When viewed from the top, the first perforation holes P1 are arranged in the form of a lattice.

The light absorbing layer 300 is disposed on the back electrode layer 200. An outer peripheral side 301 of the light absorbing layer 300 corresponds to the outer peripheral side of the support substrate 100. That is, the outer peripheral side 301 of the light absorbing layer 300 extends along the outer peripheral side of the support substrate 100.

The outer peripheral side 301 of the light absorbing layer 300 is disposed inside the outer peripheral side of the support substrate 100. That is, the outer peripheral side 301 of the light absorbing layer 300 is disposed at a plane different from a plane of the outer peripheral side of the support substrate 100.

In addition, the outer peripheral side 301 of the light absorbing layer 300 is disposed at a plane different from a plane of the outer peripheral side 201 of the back electrode layer 200. In detail, the outer peripheral side 301 of the light absorbing layer 300 is disposed outside the outer peripheral side 201 of the back electrode layer 200.

Therefore, the light absorbing layer 300 forms a step difference with respect to the back electrode layer 200. In detail, the light absorbing layer 300 is stacked on the back electrode layer 200 in the form of a reverse stair. That is, a distance between the outer peripheral side 301 of the light absorbing layer 300 and the outer peripheral side of the support substrate 100 shorter than a distance D2 between the outer peripheral side 201 of the back electrode layer 200 and the outer peripheral side of the support substrate 100.

Thus, a recess 210 is formed between the light absorbing layer 300 and the support substrate 100. In addition, the outer peripheral side 301 of the light absorbing layer 300 is spaced apart from the outer peripheral side 201 of the back electrode layer 200 by about 0.1 mm to about 10 mm.

The light absorbing layer 300 covers the region where the back electrode layer 200 is aligned. That is, the region where the light absorbing layer 300 is aligned is larger than the region where the back electrode layer 200 is aligned. A surface area of the light absorbing layer 300 is larger than a surface area of the back electrode layer 200.

An outer peripheral portion of the light absorbing layer 300 surrounds the back electrode layer 200. That is, the outer peripheral portion of the back electrode layer 200 is arranged inside the outer peripheral portion of the light absorbing layer 300. A material included in the light absorbing layer 300 is filled in the first perforation holes P1.

The light absorbing layer 300 may include group compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 has an energy bandgap in the range of about 1 eV to about 1.8 eV.

The buffer layer 400 is disposed on the light absorbing layer 300. The buffer layer 400 has a planar shape the same as that of the light absorbing layer 300. The buffer layer 400 includes CdS and has an energy bandgap in the range of about 2.2 eV to about 2.4 eV.

The high-resistance buffer layer 500 is disposed on the buffer layer 400. The high-resistance buffer layer 500 has a planar shape the same as that of the light absorbing layer 300. The high-resistance buffer layer 500 includes iZnO, which is zinc oxide not doped with impurities.

Second perforation holes P2 are formed in the light absorbing layer 300, the buffer layer 400 and the high-resistance buffer layer 500. The second perforation holes P2 are formed through the light absorbing layer 300. In addition, the second perforation holes P2 may serve as an open region to expose the top surface of the back electrode layer 200.

The second perforation holes P2 are adjacent to the first perforation holes P1. That is, when viewed from the top, some second perforation holes P2 are formed next to the first perforation holes P1.

The second perforation holes P2 may have a width in the range of about 80 μm to about 200 μm.

In addition, a plurality of light absorbing parts are defined in the light absorbing layer 300 by the second perforation holes P2. That is, the light absorbing layer 300 is divided into a plurality of light absorbing parts by the second perforation holes P2.

A plurality of buffers are defined in the buffer layer 400 by the second perforation holes P2. That is, the buffer layer 400 is divided into a plurality of buffers by the second perforation holes P2.

A plurality of high-resistance buffers are defined in the high-resistance buffer layer 500 by the second perforation holes P2. That is, the high-resistance buffer layer 500 is divided into a plurality of high-resistance buffers by the second perforation holes P2.

The front electrode layer 600 is disposed on the high-resistance buffer layer 500. The front electrode layer 600 has a planar shape corresponding to that of the light absorbing layer 300.

An outer peripheral side 601 of the front electrode layer 600 may correspond to the outer peripheral portion of the support substrate 100. That is, the outer peripheral side 601 of the front electrode layer 600 may extend along the outer peripheral side of the support substrate 100.

The outer peripheral side 601 of the front electrode layer 600 is disposed inside the outer peripheral portion of the support substrate 100. That is, the outer peripheral side 601 of the front electrode layer 600 is disposed on a plane different from a plane where the outer peripheral portion of the support substrate 100 is disposed.

The outer peripheral side 601 of the front electrode layer 600 can be disposed on the same plane with the outer peripheral side 301 of the light absorbing layer 300. That is, when viewed from the top, the front electrode layer 600 matches with the light absorbing layer 300.

Otherwise, the outer peripheral side 601 of the front electrode layer 600 can be disposed inside the outer peripheral side 301 of the light absorbing layer 300. That is, the front electrode layer 600 is stacked on the light absorbing layer 300 while forming a step difference therebetween.

In addition, the outer peripheral side 601 of the front electrode layer 600 may be disposed on the plane different from the plane where the outer peripheral side 201 of the back electrode layer 200. In detail, the outer peripheral side 601 of the front electrode layer 600 may be disposed outside the outer peripheral side 201 of the back electrode layer 200.

Thus, a distance between the outer peripheral side 601 of the front electrode layer 600 and the outer peripheral side 201 of the back electrode layer 200 is in the range of about 0.1 mm to about 10 mm.

The front electrode layer 600 covers the region where the back electrode layer 200 is aligned. That is, the region where the front electrode layer 600 is aligned is larger than the region where the back electrode layer 200 is aligned. A surface area of the front electrode layer 600 is larger than a surface area of the back electrode layer 200.

The front electrode layer 600 is a transparent conductive layer. The front electrode layer 600 includes conductive oxide. For instance, the front electrode layer 600 may include zinc oxide, indium tin oxide (ITO) or indium zinc oxide (IZO).

In addition, the oxide may include conductive dopant, such as Al, $Al_2O_3$, Mg or Ga. In detail, the front electrode layer 60 may include Al doped zinc oxide (AZO) or Ga doped zinc oxide (GZO).

Third perforation holes P3 are formed in the light absorbing layer 300, the buffer layer 400, the high-resistance buffer layer 500 and the front electrode layer 600. The third perforation holes P3 may serve as an open region to expose the top surface of the back electrode layer 200. For instance, the third perforation holes P3 may have a width in the range of about 80 μm to about 200 μm.

The third perforation holes P3 are adjacent to the second perforation holes P2. In detail, the third perforation holes P3 are disposed next to the second perforation holes P2. In more detail, when viewed from the top, the third perforation holes P3 are disposed next to the second perforation holes P2 in parallel to the second perforation holes P2.

The front electrode layer 600 is divided into a plurality of front electrodes by the third perforation holes P3. That is, the front electrodes are defined in the front electrode layer 600 by the third perforation holes P3.

The front electrodes have shapes corresponding to shapes of the back electrodes. That is, the front electrodes are arranged in the form of a stripe. In addition, the front electrodes can be arranged in the form of a matrix.

Further, a plurality of cells C1, C2 . . . and Cn are defined by the third perforation holes P3. In detail, the cells C1, C2 . . . and Cn are defined by the second and third perforation holes P2 and P3. That is, the solar cell apparatus is divided into the cells C1, C2 . . . and Cn by the second and third perforation holes P2 and P3.

The connectors 700 connect adjacent cells. In detail, the connectors 700 connect front electrodes of the adjacent cells to the back electrodes of the adjacent cells.

The connector 700 is integrally formed with the front electrode layer 600. That is, the material used for the connector 700 is identical to the material used for the front electrode layer 600.

In the solar cell apparatus according to the embodiment, the outer peripheral side 201 of the back electrode layer 200 is disposed on the plane different from the plane where the outer peripheral side 601 of the front electrode layer 600 is disposed. Thus, the distance between the outer peripheral side 201 of the back electrode layer 200 and the outer peripheral side 601 of the front electrode layer 600 is increased.

That is, the step difference is formed between the back electrode layer 200 and the light absorbing layer 300. Thus, as the distance between the outer peripheral side 201 of the back electrode layer 200 and the outer peripheral side 301 of the light absorbing 300 is increased, the distance between the outer peripheral side 201 of the back electrode layer 200 and the outer peripheral side 601 of the front electrode layer 600 is increased.

Therefore, the solar cell apparatus according to the embodiment can prevent the electric short from occurring between the outer peripheral side 201 of the back electrode layer 200 and the outer peripheral side 601 of the front electrode layer 600 is increased. In addition, the solar cell apparatus according to the embodiment can block the leakage current leaked through the outer peripheral side 201 of the back electrode layer 200 and the outer peripheral side 601 of the front electrode layer 600 is increased.

The solar cell apparatus according to the embodiment can prevent the electric short and the leakage current from occurring at the outer peripheral side 201 of the back electrode layer 200 and the outer peripheral side 601 of the front electrode layer 600. Therefore, the solar cell apparatus according to the embodiment can improve the electric characteristics and the photoelectric conversion efficiency.

FIGS. 3 to 11 are sectional views showing a method for manufacturing the solar cell apparatus according to the embodiment. The previous description about the solar cell apparatus will be incorporated herein by reference.

Figure 3:
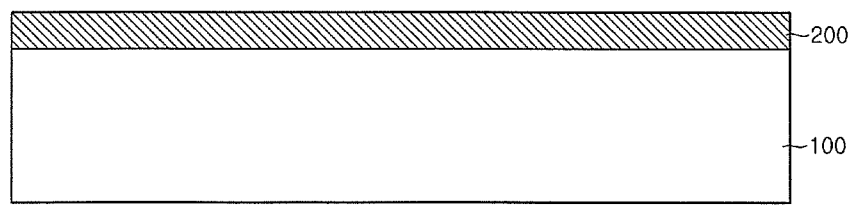
FIGS. 3 to 11 are sectional views showing a method for manufacturing a solar cell apparatus according to the embodiment.

Referring to FIG. 3, the back electrode layer 200 is formed on the support substrate 100.

The support substrate 100 may include glass. A ceramic substrate, a metal substrate or a polymer substrate may be used as the support substrate 100.

For instance, the glass substrate may include soda lime glass or high stained point soda glass, the metal substrate may include stainless steel or titanium, and the polymer substrate may include polyimide.

The support substrate 100 may be transparent, rigid or flexible.

The back electrode layer 200 may include a conductor, such as a metal.

For instance, the back electrode layer 200 can be performed through the sputtering process by using molybdenum (Mo) as a target.

Since the molybdenum (Mo) has the high electric conductivity, the molybdenum can improve the ohmic contact with respect to the light absorbing layer 300 and can maintain high-temperature stability under the Se atmosphere.

The molybdenum (Mo) layer serving as the back electrode layer 200 must have a low specific resistance as an electrode and must have high adhesive property with respect to the substrate 100 such that the delamination phenomenon may not occur due to the difference of the thermal expansion coefficient.

Meanwhile, the back electrode layer 200 can be formed by using molybdenum (Mo) doped with sodium ions.

Although not shown in the drawings, the back electrode layer 200 may include at least one layer. If the back electrode layer 200 includes a plurality of layers, the layers may be formed by using materials different from each other.

Figure 4:
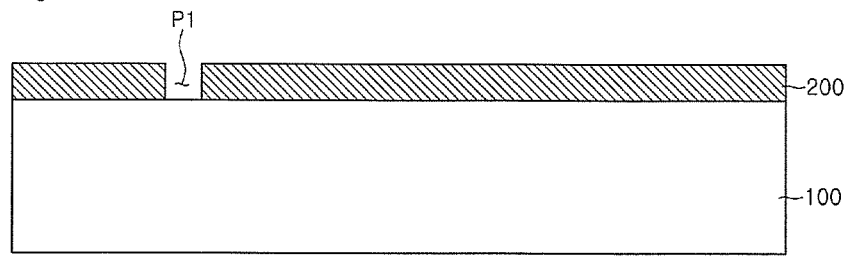

Referring to FIG. 4, first perforation holes P1 are formed in the back electrode layer 200 so that the back electrode layer 200 is divided by the first perforation holes P1. The first perforation holes P1 selectively expose the top surface of the support substrate 100.

For instance, the first perforation holes P1 can be patterned by a mechanical device or a laser device. The first perforation holes P1 may have a width in the range of about 60 μm to about 100 μm.

The back electrode layer 200 can be patterned in the form of a stripe or a matrix by the first perforation holes P1 and may correspond to each cell.

Meanwhile, the back electrode layer 200 may have various shapes in addition to the above shapes.

Figure 5:
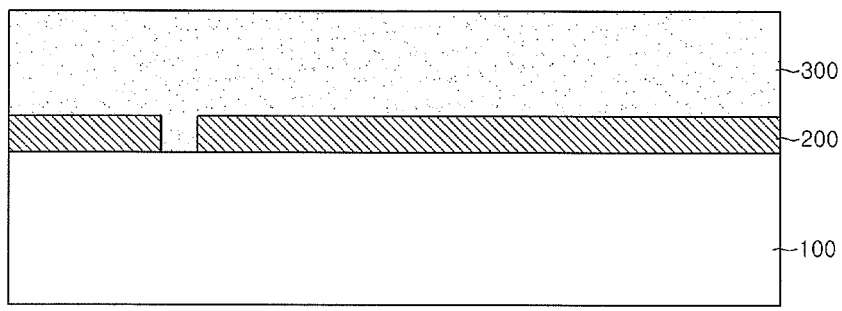

Referring to FIG. 5, the light absorbing layer 300 is formed on the back electrode layer 200 including the first perforation holes P1.

The light absorbing layer 300 may include group compounds. For instance, the light absorbing layer 300 may include $Cu(In,Ga)Se_2$ (CIGS) compounds.

In addition, the light absorbing layer 300 may include $Cu(In)Se_2$ (CIS) compound or $Cu(Ga)Se_2$ (CGS) compound.

For instance, in order to form the light absorbing layer 300, a CIG metal precursor layer is formed on the back electrode layer 200 by using a Cu target, an In target, and a Ga target.

After that, the metal precursor layer reacts with Se through the selenization process, so that the CIGS light absorbing layer is formed.

In addition, the light absorbing layer 300 can be formed by co-evaporating Cu, In, Ga and Se.

The light absorbing layer 300 receives external light to convert the external light into electric energy. The light absorbing layer 300 generates optical electromotive force through the photoelectric conversion effect.

Figure 6:
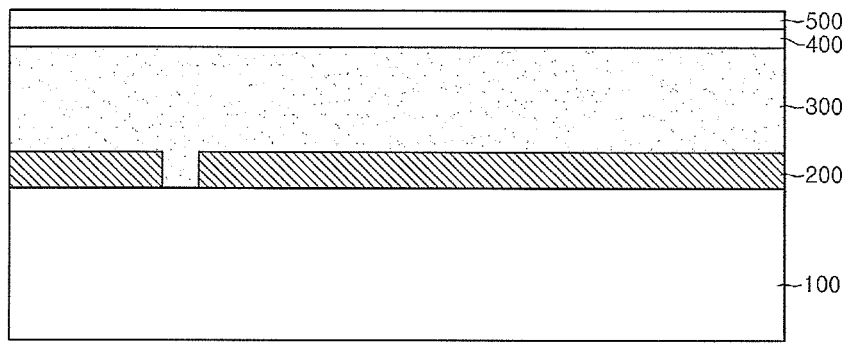

Referring to FIG. 6, the buffer layer 400 and the high-resistance buffer layer 500 are formed on the light absorbing layer 300. The buffer layer 400 formed on the light absorbing layer 300 may include at least one layer. The buffer layer 400 can be formed by depositing CdS through the CBD process.

The buffer layer 400 is an N type semiconductor layer and the light absorbing layer 300 is a P type semiconductor layer. Thus, a PN junction is formed by the light absorbing layer 300 and the buffer layer 400.

The high-resistance buffer layer 500 is formed on the buffer layer 400 as a transparent electrode layer.

For instance, the high-resistance buffer layer 500 may include one of ITO, ZnO and i-ZnO.

The high-resistance buffer layer 500 can be formed as a ZnO layer by performing the sputtering process using ZnO as a target.

The buffer layer 400 and the high-resistance buffer layer 500 are disposed between the light absorbing layer 300 and the front electrode, which will be formed later.

That is, since there are great difference in the lattice constant and the energy bandgap between the light absorbing layer 300 and the front electrode, if the buffer layer 400 and the high-resistance buffer layer 500 having the intermediate bandgap are disposed between the light absorbing layer 300 and the front electrode, the superior junction property can be obtained.

According to the present embodiment, two buffer layers 400 are formed on the light absorbing layer 300. However, the embodiment is not limited thereto. For instance, one buffer layer 400 can be formed on the light absorbing layer 300.

Figure 7:
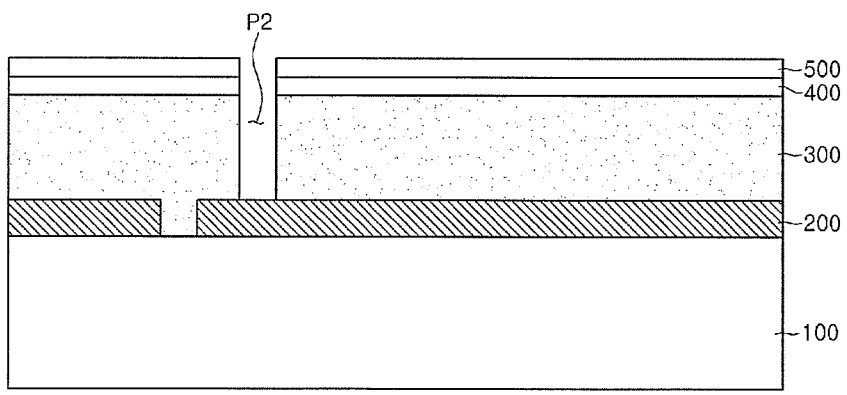

Referring to FIG. 7, the second perforation holes P2 are formed through the high-resistance buffer layer 500, the buffer layer 400 and the light absorbing layer 300. The second perforation holes P2 can selectively expose the back electrode layer 200.

The second perforation holes P2 can be formed by using a mechanical device, such as a tip, or a laser device.

The second perforation holes P2 are aligned adjacent to the first perforation holes P1.

For instance, the second perforation holes P2 may have a width in the range of about 60 μm to about 100 μm. In addition, a gap between the first and second perforation holes P1 and P2 is in the range of about 60 μm to about 100 μm.

Figure 8:
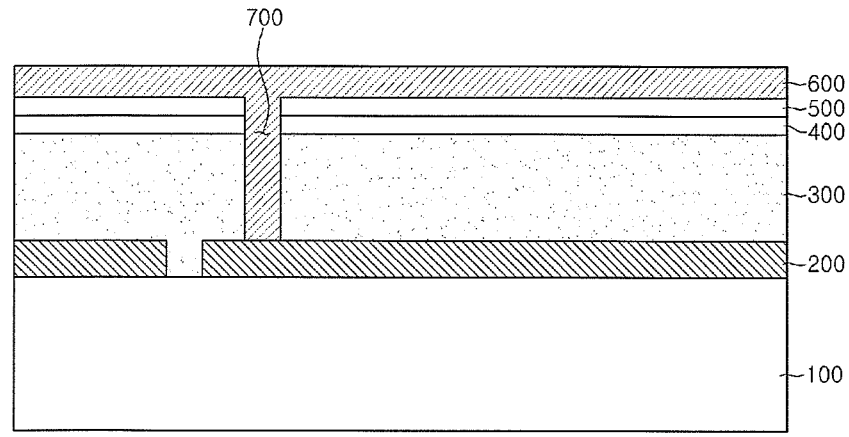

Referring to FIG. 8, a transparent conductive material is deposited on the high-resistance buffer layer 500 so that the front electrode layer 600 is formed.

When the front electrode layer 600 is formed, the transparent conductive material is filled in the second perforation holes P2 so that the connectors 700 are formed.

The front electrode layer 600 can be formed by performing the sputtering process using Al or ZnO doped with $Al_2O_3$.

The front electrode layer 600 is a window layer that forms the PN junction together with the light absorbing layer 300. Since the front electrode layer 600 serves as a transparent electrode at the front of the solar cell, the front electrode layer 600 is formed by using ZnO having high light transmittance and superior electric conductivity.

Therefore, the electrode having a low resistance value can be formed by doping the ZnO with Al or $Al_2O_3$.

The ZnO layer serving as the front electrode layer 600 can be formed through the RF sputtering process using the ZnO target, the reactive sputtering process using the Zn target or the organic metal chemical deposition process.

In addition, the front electrode layer 600 may have a dual structure by depositing an ITO layer having the superior photoelectric property on the ZnO layer.

Figure 9:
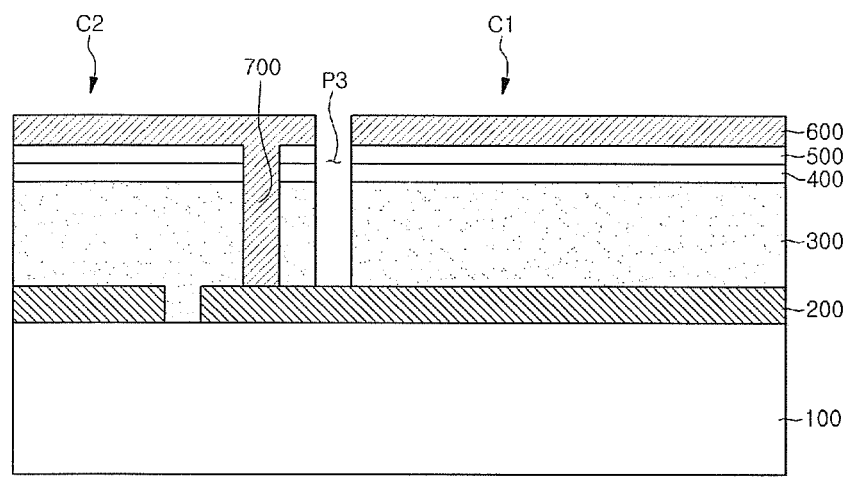

Referring to FIG. 9, the third perforation holes P3 are formed through the front electrode layer 600, the high-resistance buffer layer 500, the buffer layer 400 and the light absorbing layer 300.

The third perforation holes P3 can selectively expose the back electrode layer 200. The third perforation holes P3 are aligned adjacent to the second perforation holes P2.

For instance, the third perforation holes P3 may have a width in the range of about 60 μm to about 100 μm. In addition, a gap between the second and third perforation holes P2 and P3 is in the range of about 60 μm to about 100 μm.

The third perforation holes P3 can be formed through the laser irradiation scheme or the mechanical scheme by using a tip.

Therefore, the light absorbing layer 300, the buffer layer 400, the high-resistance buffer layer 500 and the front electrode layer 600 can be separated as unit cells by the third perforation holes P3.

That is, the cells C1, C2 . . . and Cn are separated from each other by the third perforation holes P3.

In addition, the light absorbing layer 300, the buffer layer 400, the high-resistance buffer layer 500 and the front electrode layer 600 can be arranged in the form of a stripe or matrix by the third perforation holes P3.

Besides the above, the third perforation holes P3 can be variously arranged. At this time, the cells can be connected to each other by the connectors 700. In detail, the connector 700 can physically and electrically connect the back electrode of the second cell C2 to the front electrode of the first cell C1 adjacent to the second cell C2.

Figure 10:
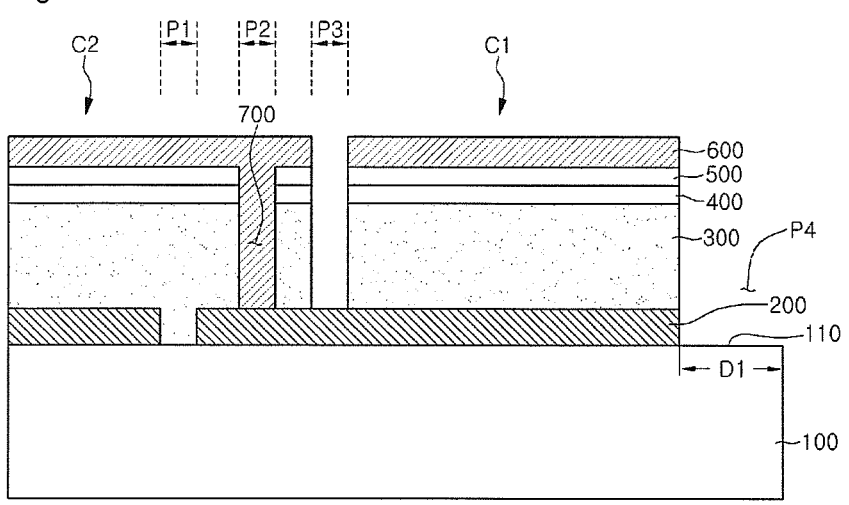

Referring to FIG. 10, outer peripheral portions of the back electrode layer 200, the light absorbing layer 300, the buffer layer 400, the high-resistance buffer layer 500 and the front electrode layer 600 are primarily removed. Thus, a first edge pattern P4 is formed at the outer peripheral portions of the back electrode layer 200, the light absorbing layer 300, the buffer layer 400, the high-resistance buffer layer 500 and the front electrode layer 600.

A part 110 of the top surface of the support substrate 100 is exposed through the first edge pattern P4. The first edge pattern P4 may extend along the outer peripheral portion of the support substrate 100. In detail, the first edge pattern P4 may have the closed loop shape. The first edge pattern P4 may have a width in the range of about 1 cm to about 10 cm.

The first edge pattern P4 can be formed through the mechanical scribing process by using a tip or the laser irradiation process. In particular, the laser can be used when the outer peripheral portion of the back electrode layer 300 is removed.

As a result of the primary removal process, lateral sides of the back electrode layer 200, the light absorbing layer 300, the buffer layer 400, the high-resistance buffer layer 500 and the front electrode layer 600 are vertical to the top surface of the support substrate 100.

In addition, the lateral sides of the back electrode layer 200, the light absorbing layer 300, the buffer layer 400, the high-resistance buffer layer 500 and the front electrode layer 600, which are formed through the primary removal process, are aligned on the same plane and have the uniform surfaces.

The outer peripheral portions of the back electrode layer 200, the light absorbing layer 300, the buffer layer 400, the high-resistance buffer layer 500 and the front electrode layer 600 may be non-uniformly deposited. The non-uniform portions can be removed through the primary removal process, so the performance of the solar cell apparatus according to the embodiment can be improved.

Figure 11:
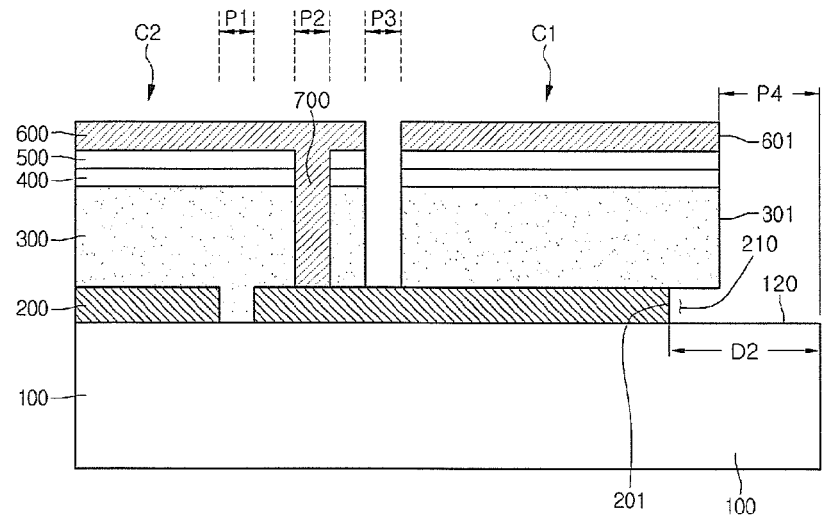

Referring to FIG. 11, an outer peripheral portion of the back electrode layer 200 is secondarily removed. Thus, a second edge pattern 210 is formed at the outer peripheral portion of the back electrode layer 200. The second edge pattern 210 is a recess formed between the light absorbing layer 300 and the support substrate 100.

The secondary removal process may include the etching process. In detail, the outer peripheral portion of the back electrode layer 200 is secondarily removed through the wet etching process. In more detail, the etchant capable of selectively etching the back electrode layer 200 can be used in the secondary removal process. The etchant may include phosphoric acid, nitric acid, acetic acid or hydrogen peroxide.

In other words, the secondary removal process can be performed by spraying the etchant onto the outer peripheral portion of the back electrode layer 200. For instance, the outer peripheral portion of the back electrode layer 200 can be removed by using an etching device including a nozzle for spraying the etchant and a vacuum for sucking by-products.

In detail, the nozzle sprays the etchant onto the outer peripheral portion of the back electrode layer 200 while moving along the outer peripheral portion of the back electrode layer 200. The vacuum sucks the etchant sprayed from the nozzle and the by-products of the etching process. The vacuum may move together with the nozzle.

The outer peripheral portion of the back electrode layer 200 can be secondarily removed through the dipping scheme. That is, the outer peripheral portion of the back electrode layer 200 subject to the primary removal process can be dipped in a bath filled with the etchant.

In detail, in a state that the support substrate 100 is erected upright, only the outer peripheral portion of the support substrate 100 may be dipped in the etchant. In this manner, four outer peripheral sides of the support substrate 100 can be immersed in the etchant in turn.

Therefore, the width D2 of the second edge pattern 210 is larger than the width D1 of the first edge pattern P4. That is, the outer peripheral side 201 of the back electrode layer 200 may be recessed with respect to the outer peripheral side 301 of the light absorbing layer 300.

As described above, since the secondary removal process includes the etching process, the by-products generated during the first removal process can be effectively removed. That is, the by-products, such as particles generated during the mechanical scribing process or the laser process, can be removed. Thus, the solar cell apparatus according to the embodiment can prevent the electric short caused by the by-products.

In addition, since the outer peripheral side 201 of the back electrode layer 200 is recessed inward with respect to the outer peripheral side 301 of the light absorbing layer 300, the distance between the outer peripheral side 201 of the back electrode layer 200 and the outer peripheral side 601 of the front electrode layer 600 can be increased.

Thus, the method for manufacturing the solar cell apparatus according to the embodiment can prevent the electric short from occurring between the front electrode layer 600 and the back electrode layer 200. In particular, since the particles remaining on the outer peripheral side 301 of the light absorbing layer 300 and the exposed top surface of the support substrate 100 can be removed, the electric short can be prevented at the outer peripheral portion of the solar cell apparatus and the insulating property can be ensured.

Figure 12:
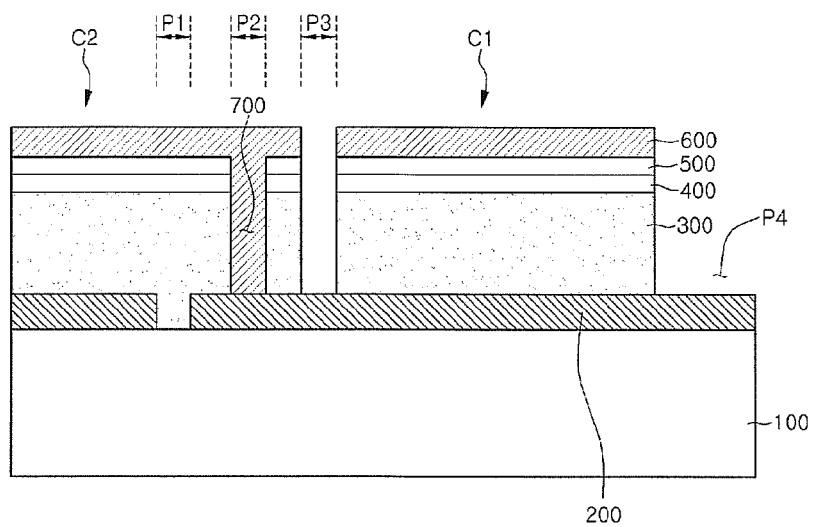
FIGS. 12 and 13 are sectional views showing a method for manufacturing a solar cell apparatus according to another embodiment.
Figure 13:
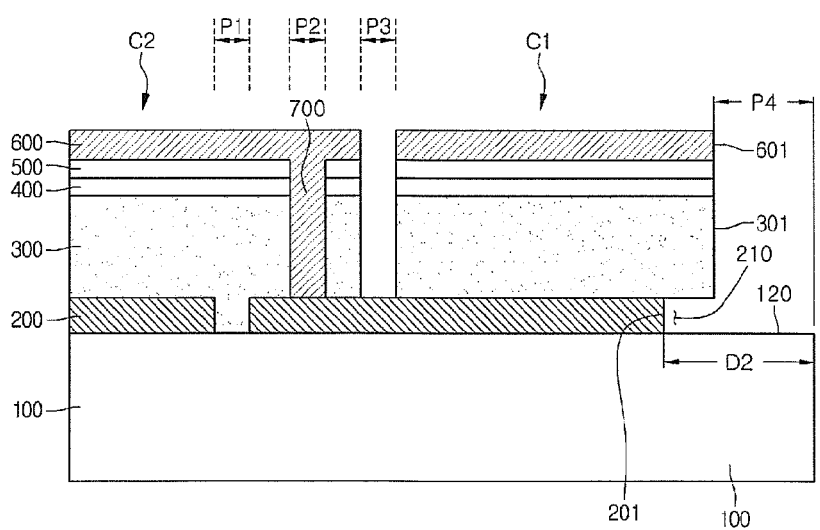

FIGS. 12 and 13 are sectional views showing a method for manufacturing a solar cell apparatus according to another embodiment. The previous description about the solar cell apparatus and the manufacturing method thereof will be incorporated herein by reference.

Referring to FIG. 12, the back electrode layer 200, the light absorbing layer 300, the buffer layer 400, the high-resistance buffer layer 500 and the front electrode layer 600 are sequentially formed on the support substrate 100.

Then, the outer peripheral portions of the light absorbing layer 300, the buffer layer 400, the high-resistance buffer layer 500 and the front electrode layer 600 are primarily removed. Thus, the first edge pattern P4 is formed. The primary removal process can be performed through the mechanical scheme by using the tip.

Since the light absorbing layer 300, the buffer layer 400, the high-resistance buffer layer 500 and the front electrode layer 600 may have the crystal structure, they can be effectively removed through the mechanical scheme.

In addition, since the back electrode layer 200 includes the metal, the back electrode layer 200 may remain after the first removal process has been performed.

Referring to FIG. 13, after the first removal process has been performed, the outer peripheral portion of the back electrode layer 200 can be secondarily removed through the etching process as described above.

At this time, the condition for the second removal process is adjusted such that the outer peripheral side 201 of the back electrode layer 200 may have a recess structure with respect to the outer peripheral side 301 of the light absorbing layer 300. That is, depending on the condition of the etching process, the outer peripheral portion of the back electrode layer 200 can be removed beyond the first edge pattern P4 to form the second edge pattern 210.

According to the method of the present embodiment, the first and second edge patterns P4 and 210 can be formed without using the laser. In particular, the embodiment can provide the solar cell apparatus capable of preventing the electric short and improving the photoelectric conversion efficiency without using the laser.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The solar cell apparatus according to the embodiment can be used in the field of the solar cell power generation.

What is claimed is:

1. A solar cell apparatus comprising:
a. substrate;
a back electrode layer on the substrate;
a light absorbing layer on the back electrode layer; and
a front electrode layer on the light absorbing layer,
wherein an outer peripheral side of the back electrode layer is aligned on a plane different from a plane of an outer peripheral side of the light absorbing layer,
wherein an outer peripheral side of the front electrode layer is disposed on a side different from a side where the outer peripheral side of the back electrode layer is aligned,
wherein the outer peripheral side of the light absorbing layer is aligned on a same plane with the outer peripheral side of the front electrode layer,
wherein the outer peripheral side of the light absorbing layer is disposed outside the outer peripheral side of the back electrode layer,
wherein the outer peripheral side of the front electrode layer is disposed outside the outer peripheral side of the back electrode layer, and
wherein the apparatus comprises a recess formed in the back electrode layer between the light absorbing layer and a support substrate.

2. The solar cell apparatus of claim 1, wherein a distance between the outer peripheral side of the light absorbing layer and the outer peripheral side of the back electrode layer is in a range of about 0.1 mm to about 10 mm.

3. The solar cell apparatus of claim 1, wherein the outer peripheral side of the light absorbing layer surrounds the back electrode layer.

4. The solar cell apparatus of claim 1, wherein a surface area of the light absorbing layer is larger than a surface area of the back electrode layer.

5. The solar cell apparatus of claim 1, wherein the outer peripheral side of the light absorbing layer and the outer peripheral side of the back electrode layer correspond to an outer peripheral portion of the substrate.

6. The solar cell apparatus of claim 1, wherein a plurality of first perforation holes extending in a first direction are formed in the back electrode layer, a plurality of second perforation holes are formed in the light absorbing layer adjacent to the first perforation holes, respectively, and a plurality of third perforation holes are formed in the front electrode layer adjacent to the second perforation holes, respectively.

* * * * *